United States Patent [19]

Tanaka et al.

[11] Patent Number: 5,450,043
[45] Date of Patent: Sep. 12, 1995

[54] QUADRATURE MODULATOR WITH DISTORTION COMPENSATION

[75] Inventors: Yasuhide Tanaka; Masaho Kimura, both of Mitaka, Japan

[73] Assignee: Japan Radio Co., Ltd., Tokyo, Japan

[21] Appl. No.: 222,115

[22] Filed: Apr. 1, 1994

[30] Foreign Application Priority Data

Jun. 30, 1993 [JP] Japan .................................. 5-162871

[51] Int. Cl.⁶ .......................... H03C 1/06; H03C 3/08; H04B 1/04
[52] U.S. Cl. ..................................... 332/103; 332/123; 332/161; 332/162; 375/296; 455/118; 455/126
[58] Field of Search ................ 332/102, 103, 104, 105, 332/106, 123, 124, 125, 126, 127, 128, 144, 145, 146, 147, 148, 159, 160, 161, 162, 170; 307/512; 328/162, 163, 164, 165, 166, 167; 330/107.149; 375/51, 57, 58, 60; 455/126, 118

[56] References Cited

U.S. PATENT DOCUMENTS

| | | | |
|---|---|---|---|
| 3,900,823 | 8/1975 | Sokal et al. | 330/149 |
| 4,243,955 | 1/1981 | Daniel et al. | 455/126 X |
| 4,951,000 | 8/1990 | Dautriche | 307/512 X |
| 5,121,077 | 6/1992 | McGann | 330/107 X |
| 5,293,406 | 3/1994 | Suzuki | 375/60 X |

FOREIGN PATENT DOCUMENTS

| | | |
|---|---|---|
| 0377519 | 7/1990 | European Pat. Off. |
| 0441579 | 8/1991 | European Pat. Off. |
| 5-75658 | 3/1993 | Japan . |
| 5-90841 | 4/1993 | Japan . |
| 2259203 | 3/1993 | United Kingdom . |
| WO91/06149 | 5/1991 | WIPO . |

OTHER PUBLICATIONS

Patent Abstracts of Japan, vol. 17, No. 404 (E-1405) Jul. 28, 1993 & JP-A-05 075 658, (Japan Radio Co., Ltd.) Mar. 26, 1993.

*Primary Examiner*—David Mis
*Attorney, Agent, or Firm*—Frishauf, Holtz, Goodman, Langer & Chick

[57] ABSTRACT

A quadrature modulator multiplies two carriers which are 90° out of phase with each other by a sine component and a cosine component of a baseband signal, respectively, adds the product signals to each other, and amplifies the sum signal to produce a quadrature-modulated output signal. The quadrature modulator includes a phase comparator for detecting a phase distortion suffered when the sum signal is amplified, a first phase controller for correcting the phase of a single carrier generated by a carrier oscillator based on a compared phase output signal from the phase comparator, a phase difference detector for detecting the difference between 90° and the phase difference between the two carriers, and a second phase controller for outputting the two carriers to be multiplied by the sine and cosine components of the baseband signal and controlling the phase difference between the two carriers generated from the single carrier whose phase distortion has been corrected by the first phase controller, into 90° based on a detected output signal from the phase difference detector.

4 Claims, 7 Drawing Sheets

QUADRATURE MODULATOR WITH DISTORTION COMPENSATION

BACKGROUND OF THE INVENTION

1. Field of the Invention

The present invention relates to a quadrature modulator suitable for use in digital mobile communications.

2. Description of the Conventional Art

Japanese laid-open patent publication No. 5-75658, for example, discloses a conventional quadrature modulator. The disclosed quadrature modulator has a differential converter converting an input carrier into two carriers that are 180° out of phase with each other, i.e., a positive-phase carrier and a negative-phase carrier. The amplitude ratio of the positive- and negative-phase carriers is controlled by an amplitude ratio control circuit based on a phase difference signal that is detected by a phase difference detector. After the amplitude ratio has been controlled, the positive- and negative-phase carriers are supplied to a phase converter, which converts them into two carriers having a phase difference based on the amplitudes of the positive- and negative-phase carriers whose amplitude ratio has been controlled. The two carriers outputted from the phase converter are then limited in amplitude separately by respective limiters. The phase difference detector then detects the difference between 90° and the phase difference between the amplitude-limited carriers outputted from the phase converter. The detected phase difference outputted from the phase difference detector is supplied to the amplitude ratio control circuit, which controls the amplitude ratio so that the carriers outputted from the phase converter will be 90° out of phase with each other. The carriers outputted from the phase converter as they are limited in amplitude by the limiters are multiplied by sine and cosine components of a baseband signal, and the product output signals are combined with each other.

In the case where the conventional quadrature modulator is implemented by an integrated circuit, any changes in the phase relationship between the carriers, which would otherwise be caused by characteristic variations of circuit components and fluctuations of the constants of circuit components due to temperature changes, are suppressed. It is desirable that the quadrature modulator be not affected by absolute errors of the constants of circuit components and frequency changes of the carriers, and that a phase distortion produced by an amplifier be corrected when the modulated signal is amplified by the amplifier.

SUMMARY OF THE INVENTION

It is an object of the present invention to provide a quadrature modulator which is not affected by absolute errors of the constants of circuit components and frequency changes of the carriers, and which correct a phase distortion caused when a quadrature-modulated signal is amplified.

According to a first aspect of the present invention, there is provided a quadrature modulator for producing a quadrature-modulated output signal by multiplying one of two carriers which are 90° out of phase with each other by a sine component of a baseband signal, multiplying the other of the two carriers by a cosine component of the baseband signal, and adding the products of the multiplication to each other to produce the quadrature-modulated output signal, the quadrature modulator comprising phase distortion detecting means for detecting a phase distortion suffered when a sum signal produced by adding the products of the multiplication to each other is amplified to produce the quadrature-modulated output signal, phase distortion correcting means for producing a phase-corrected carrier signal by correcting the phase of a single carrier generated by a carrier oscillator, based on the phase distortion detected by the phase distortion detecting means, phase difference detecting means for detecting the difference between 90° and the phase difference between the two carriers, and carrier generating means for generating the two carriers from the phase-corrected carrier signal, to be multiplied by the respective sine and cosine components of the baseband signal, and controlling a phase difference between the two carriers to be 90° based on the phase difference detected by the phase difference detecting means, the carrier generating means including an adder for producing the sum signal.

According to a second aspect of the present invention, there is provided another quadrature modulator for producing a quadrature-modulated output signal by multiplying one of two carriers which are 90° out of phase with each other by a sine component of a baseband signal, multiplying the other of the two carriers by a cosine component of the baseband signal, adding the product signals to each other to produce the quadrature-modulated output signal, the quadrature modulator comprising phase difference detecting means for detecting the difference between 90° and the phase difference between the two carriers, carrier generating means for generating the two carriers from a single carrier generated by a carrier oscillator, to be multiplied by the respective sine and cosine components of the baseband signal, and controlling the phase difference between the two carriers to be 90° based on a phase difference detected by the phase difference detecting means, the carrier generating means including an adder for adding the products of the multiplication to each other to produce a sum signal, phase distortion detecting means for detecting a phase distortion suffered when a distortion-corrected sum signal is amplified to produce the quadrature modulated output signal, and phase distortion correcting means for producing the distortion-corrected sum signal from the sum signal by correcting the phase of the sum signal based on the phase distortion detected by the phase distortion detecting means.

In each of the quadrature modulators according to the first and second aspects of the present invention, the phase difference between the two carriers produced by the carrier generating means is controlled to be 90° based on the phase difference detected by the phase difference detecting means, and the phase distortion produced when the quadrature-modulated signal is amplified is corrected by the phase distortion correcting means.

The phase distortion correcting means and the carrier generating means can be implemented as differential circuits in an integrated circuit, and hence may not be adversely affected by absolute errors in the constants of circuit components and frequency changes of the carriers.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENTS

Figure 1:
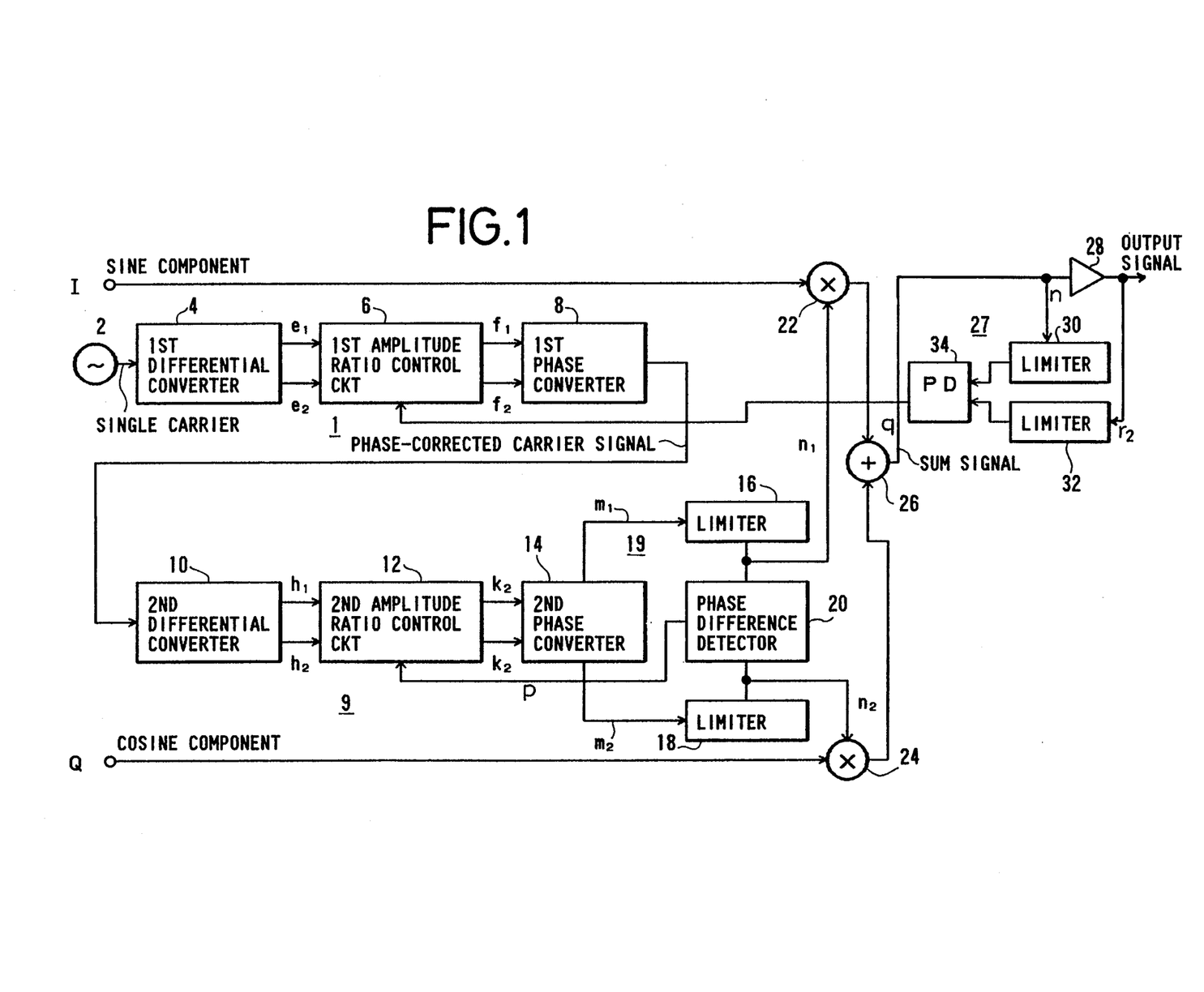
FIG. 1 is a block diagram of a quadrature modulator as a first embodiment according to the present invention.

As shown in FIG. 1, a quadrature modulator, as a first embodiment according to the present invention, includes a first phase controller 1, serving as a phase difference correcting means for controlling the phase of a single carrier outputted from the first phase controller 1 including a carrier oscillator 2, based on a phase difference produced by an amplifier circuit 27 which amplifies a modulated output signal. A second phase controller 9 generates two carriers that are substantially 90° out of phase with each other, with the single carrier whose phase has been controlled by the first phase controller 1. The difference between 90° and the phase difference between the two carriers is eliminated by a carrier generator 19. Two multipliers 22, 24 multiply the carriers, the phase difference between which has been controlled so as to be 90° by the carrier generator 19, by respective sine and cosine components of a baseband signal. An in-phase adder 26 adds the product output signals from the respective multipliers 22, 24.

The output signal from the in-phase adder 26 is amplified by the amplifier circuit 27, which outputs the amplified signal as a quadrature-modulated signal.

The phase controller 1 comprises a first differential converter 4 for differentially converting the output carrier from the carrier oscillator 2 into positive- and negative-phase carriers $e_1$, $e_2$ that are 180° out of phase with each other, a first amplitude ratio control circuit 6 for controlling the amplitude ratio of the positive- and negative-phase carriers $e_1$, $e_2$ outputted from the first differential converter 4 based on the phase difference from the amplifier circuit 27, and a first phase converter 8 for converting positive- and negative-phase carriers $f_1$ and $f_2$ whose amplitude ratio has been controlled by the first amplitude ratio control circuit 6 into the single carrier g with its phase based on the amplitude ratio of the positive- and negative-phase carriers $f_1$ and $f_2$.

Figure 2:
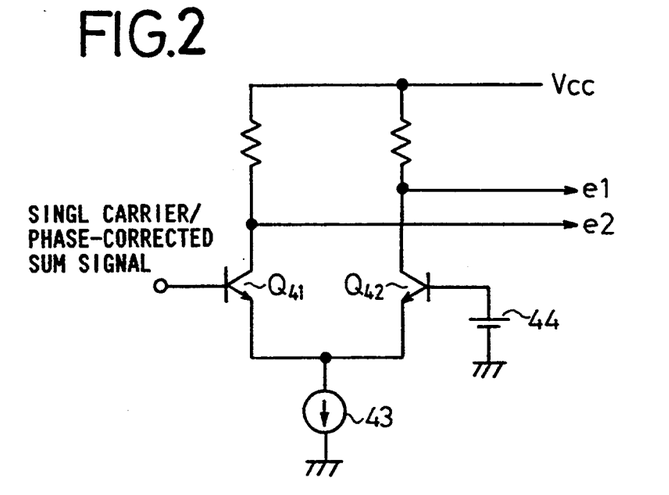
FIG. 2 is a circuit diagram of a first differential converter in the quadrature modulator.

As shown in FIG. 2, the first differential converter 4 comprises a differential amplifier including transistors Q41 and Q42, a constant-current supply circuit 43, and a constant-voltage supply 44. The carrier outputted from the carrier oscillator 2 is applied to the base of the transistor Q41, whereas the voltage from the constant-voltage supply 44 is applied to the base of the transistor Q42. The positive- and negative-phase carriers $e_1$, $e_2$ are produced from the respective collectors of the transistors Q41 and Q42.

Figure 3:
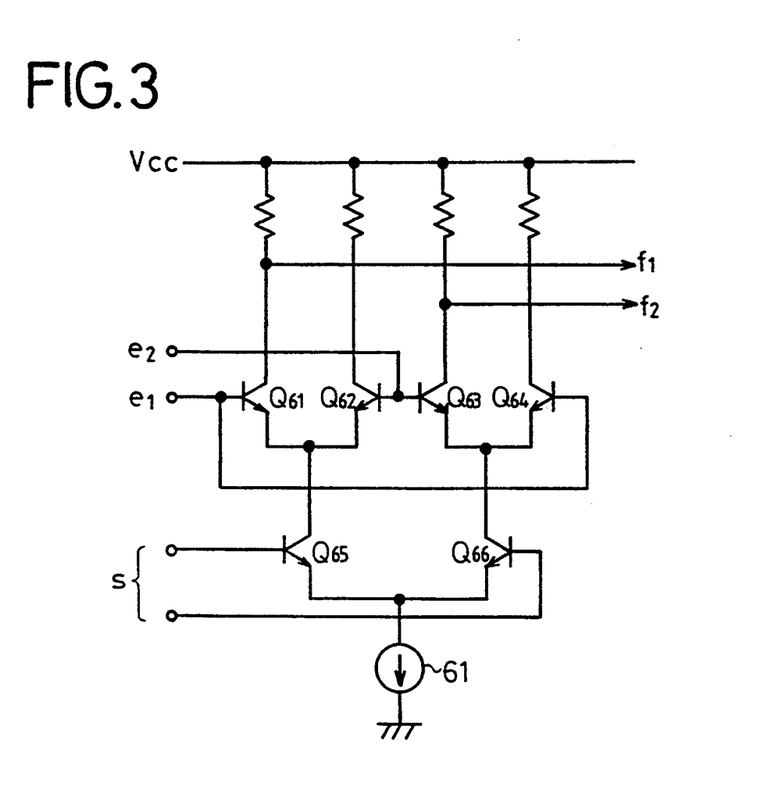
FIG. 3 is a circuit diagram of a first amplitude ratio control circuit in the quadrature modulator.

As shown in FIG. 3, the first amplitude ratio control circuit 6 comprises a double-balanced differential amplifier including transistors Q61–Q66 and a constant-current supply circuit 61. The positive-phase carrier $e_1$ is applied to the bases of the transistors Q61 and Q64, whereas the negative-phase carrier $e_2$ is applied to the bases of the transistors Q62 and Q63. To the bases of the transistors Q65 and Q66, there is applied an output signal s from a phase comparator 34 of the amplifier circuit 27. Output signals produced from the collectors of the transistors Q61 and Q63 are supplied as the positive- and negative-phase carriers $f_1$ and $f_2$ whose amplitude ratio has been controlled to the first phase converter 8.

Figure 4:
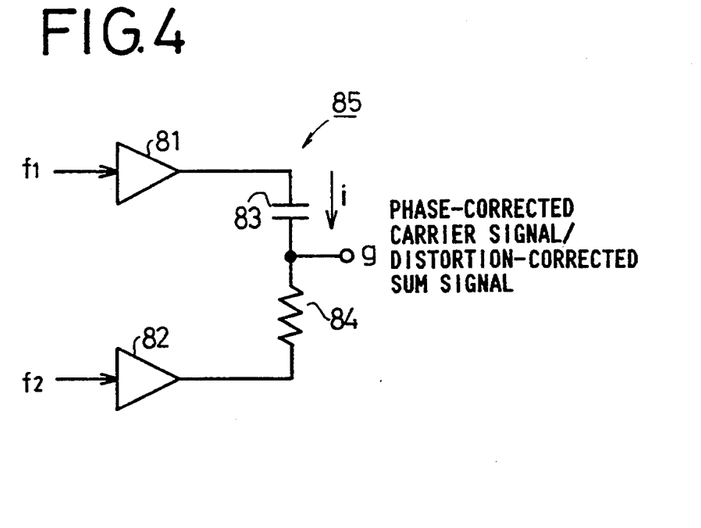
FIG. 4 is a circuit diagram of a first phase converter in the quadrature modulator.

As shown in FIG. 4, the first phase converter 8 comprises a buffer amplifier 81 for being supplied with the positive-phase carrier $f_1$, a buffer amplifier 82 for being supplied with the negative-phase carrier $f_2$, and a phase shifter 85 composed of a capacitor 83 and a resistor 84 that are connected in series with each other. The positive-phase carrier $f_1$ that has passed through the buffer amplifier 81 and the negative-phase carrier $f_2$ that has passed through the buffer amplifier 82 are applied to the respective opposite terminals of the phase shifter 85, and the phase-controlled single carrier g is outputted from the junction between the capacitor 83 and the resistor 84.

The second phase controller 9 comprises a second differential converter 10 for differentially converting the carrier g from the first phase converter 8 into positive- and negative-phase carriers $h_1$ and $h_2$, a second amplitude ratio control circuit 12 for controlling the amplitude ratio of the positive- and negative-phase carriers $h_1$ and $h_2$ outputted from the second differential converter 10 based on a detected phase difference signal p outputted from a phase difference detector 20, and a second phase converter 14 for converting positive- and negative-phase carriers $k_1$ and $k_2$ whose amplitude ratio has been controlled by the second amplitude ratio control circuit 12 into two carriers $m_1$ and $m_2$ the phase difference between which is based on the amplitude ratio of the positive- and negative-phase carriers $k_1$ and $k_2$.

The second differential converter 10 is identical in structure to the first differential converter 4, and the second amplitude ratio control circuit 12 is identical in structure to the first amplitude ratio control circuit 6.

The carrier generator 19 comprises the second phase controller 9, a pair of limiters 16 and 18 for limiting the respective amplitudes of the carriers $m_1$ and $m_2$ outputted from the second phase controller 9, and the phase difference detector 20. The phase difference detector 20 detects the difference between 90° and the phase difference between a carrier $n_1$ whose amplitude has been limited by the limiter 16 and a carrier $n_2$ whose amplitude has been limited by the limiter 18, and outputs the detected difference as the detected phase difference signal p to the second amplitude ratio control circuit 12. The carrier $n_1$ is also supplied to the multiplier 22, and the carrier $n_2$ is also supplied to the multiplier 24.

Figure 5:
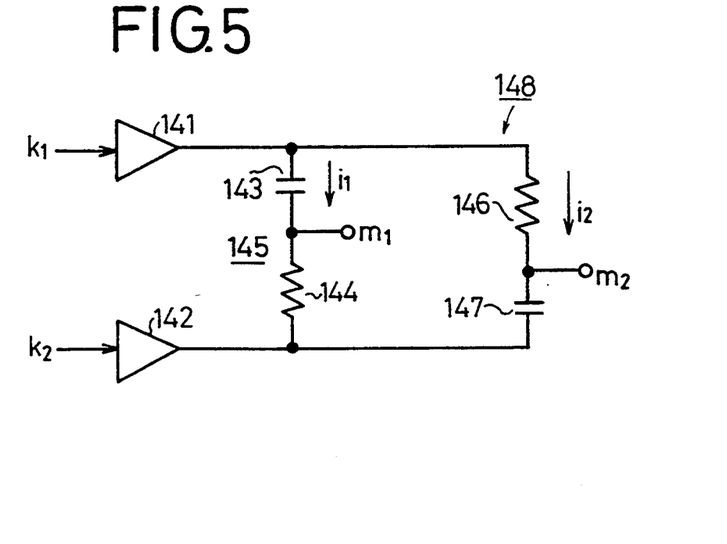
FIG. 5 is a circuit diagram of a second phase converter in the quadrature modulator.

As shown in FIG. 5, the second phase converter 14 comprises a buffer amplifier 141 for being supplied with the positive-phase carrier $k_1$, a buffer amplifier 142 for being supplied with the negative-phase carrier $k_2$, a phase shifter 145 composed of a capacitor 143 and a resistor 144 that are connected in series with each other, and a phase shifter 148 composed of a resistor 146 and a capacitor 147 that are connected in series with each other. The positive-phase Carrier $k_1$ that has passed through the buffer amplifier 141 and the negative-phase carrier $k_2$ that has passed through the buffer amplifier 142 are applied to the respective opposite terminals of each of the phase shifters 145, 148. The phase-controlled carrier $m_1$ is outputted from the junction between the capacitor 143 and the resistor 144, and the phase-controlled carrier $m_2$ is outputted from the junction between the resistor 146 and the capacitor 147.

Figure 6:
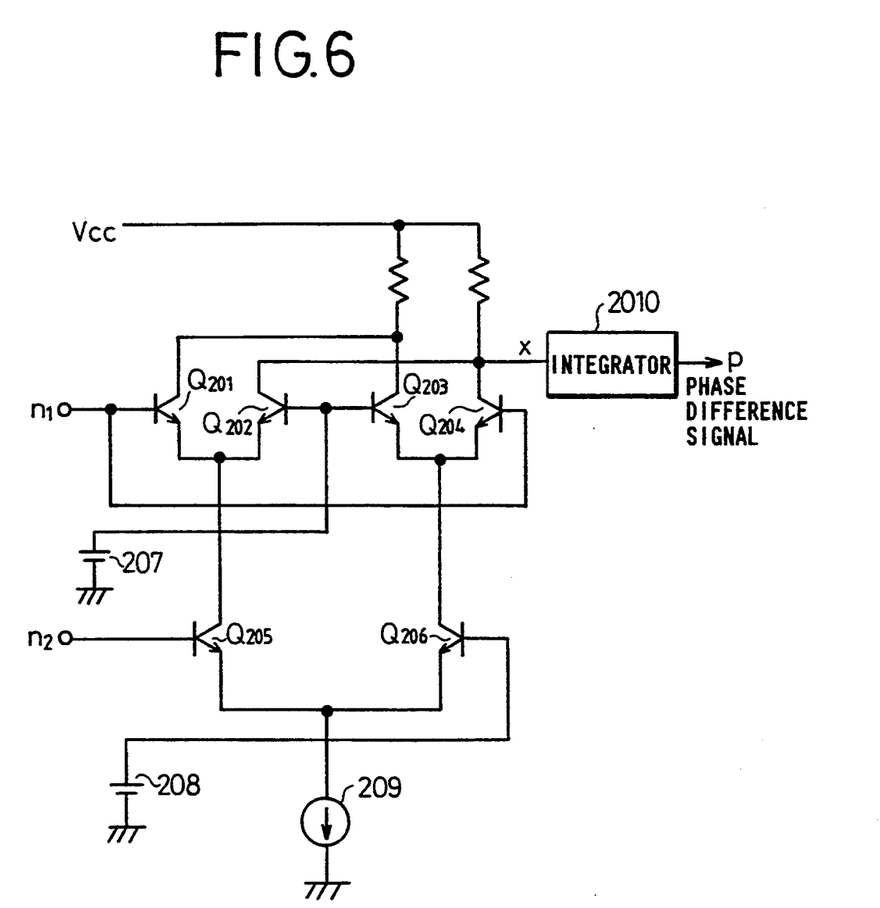
FIG. 6 is a circuit diagram of a phase difference detector in the quadrature modulator.

As shown in FIG. 6, the phase difference detector 20 comprises a balanced modulator circuit composed of transistors Q201–Q206, constant-voltage supplies 207 and 208, and a constant-current supply circuit 209, and an integrator 2010 for integrating an output signal from the balanced modulator circuit. The amplitude-limited carrier $n_1$ is applied to the bases of the transistors Q201 and Q204. The voltage from the constant-voltage supply 207 is applied to the bases of the transistors Q202 and Q203. The amplitude-limited carrier $n_2$ is applied to the base of the transistor Q205. The voltage from the constant-voltage supply 208 is applied to the base of the transistor Q206. An output signal from the collector of the transistor Q204 is integrated by the integrator 2010, which outputs an integrated signal as the detected phase difference signal p. The balanced modulator circuit delivers an output signal x representing the product of the carriers $n_1$ and $n_2$. Depending on a shift from 90° of the phase difference between the carriers $n_1$ and $n_2$, the detected phase difference signal p is of a value reduced or increased from the output signal at the time the phase difference between the carriers $n_1$ and $n_2$ is 90°.

The output signals from the respective multipliers 22, 24 are added in phase by the in-phase adder 26, which supplies a sum output signal q, i.e., a quadrature-modulated output signal to the amplifier circuit 27. The amplifier circuit 27 comprises an amplifier 28 for amplifying the sum output signal q, two limiters 30 and 32 for limiting the amplitudes of the sum output signal q, i.e., an input signal $r_1$ applied to the amplifier 28, and an output signal $r_2$ from the amplifier 28, and a phase comparator 34 for comparing the phase of the sum output signal q that has been limited in amplitude by the limiter 30 and the phase of the output signal $r_2$ that has been limited in amplitude by the limiter 32, and outputting a compared phase output signal s to the first amplitude ratio control circuit 6.

Operation of the quadrature modulator according to the present invention will be described below. The carrier outputted from the carrier oscillator 2 is differentially converted by the first differential converter 4 into the positive- and negative-phase carriers $e_1$, $e_2$ which are 180° out of phase with each other that are outputted from the respective collectors of the transistors Q41, Q42. The amplitude ratio of the positive- and negative-phase carriers $e_1$, $e_2$ is controlled by the first amplitude ratio control circuit 6 based on the compared phase output signal s. The positive- and negative-phase carriers $f_1$ and $f_2$ whose amplitude ratio has been controlled are converted by the first phase converter 8 into the carrier g whose phase is based on the amplitude ratio. Thus, the carrier g has its phase based on the compared phase output signal s.

In the first amplitude ratio control circuit 6 shown in FIG. 3, the potentials at the bases of the transistors Q65 and Q66 vary depending on the compared phase output signal s, the balanced conditions of currents flowing through the differential pairs of the transistors Q61 and Q62 and the transistors Q63 and Q 64 are controlled by the amplitudes of the carriers $e_1$ and $e_2$, and the balanced conditions of the amplitudes of output signals from these differential pairs of the transistors Q61 and Q62 and the transistors Q63 and Q64. The collectors of the transistors Q61 and Q63 output the amplitude-controlled positive- and negative-phase carriers $f_2$ and $f_1$, and supply them to the first phase converter 8.

Figure 7:
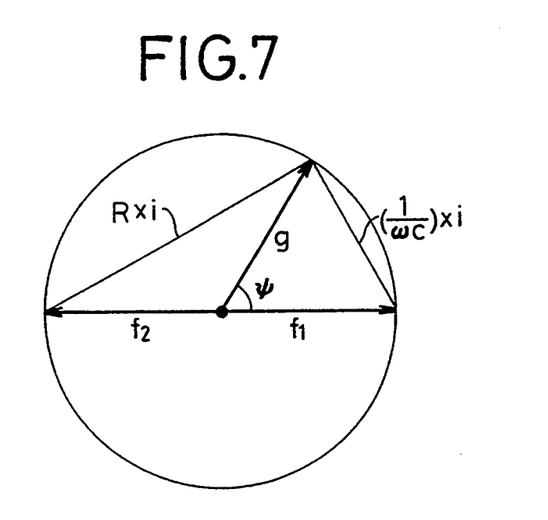
FIG. 7 is a diagram of vectors illustrative of the manner in which the first phase converter shown in FIG. 4 operates.
Figure 8:
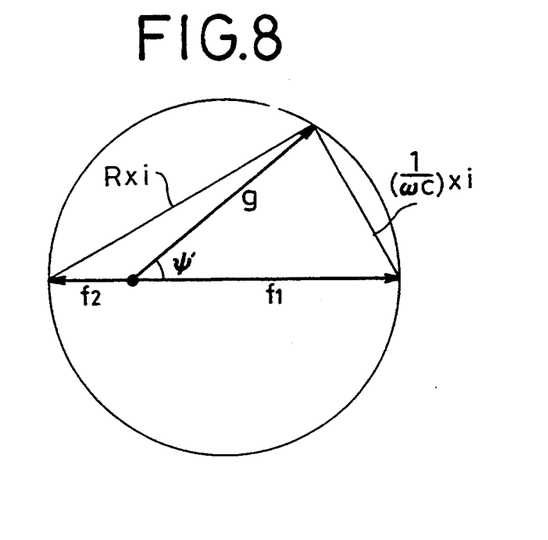
FIG. 8 is a diagram of vectors illustrative of the manner in which the first phase converter shown in FIG. 4 operates.

The positive- and negative-phase carriers $f_1$ and $f_2$ outputted from the first amplitude ratio control circuit 6 are applied through the respective buffer amplifiers 81, 82 to the phase shifter 85. It is assumed that a current i flows through the phase shifter 85, the capacitor 83 has an electrostatic capacitance C, and the resistor 84 has a resistance R. If the applied positive- and negative-phase carriers $f_1$ and $f_2$ have the same amplitude, then the carrier g outputted from the phase shifter 85 has a phase $\phi$ as shown in FIG. 7. If the applied positive- and negative-phase carriers $f_1$, $f_2$ have different amplitudes, then the carrier g outputted from the phase shifter 85 has a phase $\phi'$ as shown in FIG. 8. Therefore, the phase $\phi$ of the carrier g varies based on the applied compared phase output signal s, and hence becomes a phase $\phi_0$ which is corrected out of a phase distortion caused by the amplifier circuit 27.

In FIGS. 7 through 10, the angular frequency of the carriers is indicated by $\omega$.

The carrier g is differentially converted by the second differential converter 10 into positive- and negative-phase carriers $h_1$, $h_2$ which are in phase and 180° out of phase with the carrier g. The amplitude ratio of the positive- and negative-phase carriers $h_1$ and $h_2$ is controlled by the second amplitude ratio control circuit 12 based on the detected phase difference signal p. Positive- and negative-phase carriers $k_1$ and $k_2$ whose amplitude ratio has been controlled are then converted by the second phase converter 14 into respective carriers $m_1$ and $m_2$ whose phases are based on the amplitude ratio. Therefore, the carriers $m_1$ and $m_2$ have a phase difference that has been corrected based on the detected phase difference signal p.

The second differential converter 10 operates in the same manner as the first differential converter 4, and the second amplitude ratio control circuit 12 operates in the same manner as the first amplitude ratio control circuit 6.

Figure 9:
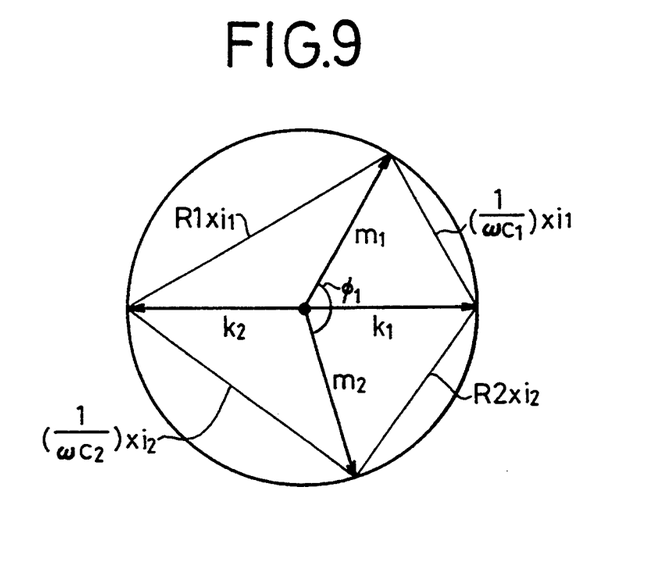
FIG. 9 is a diagram of vectors illustrative of the manner in which the second phase converter shown in FIG. 5 operates.
Figure 10:
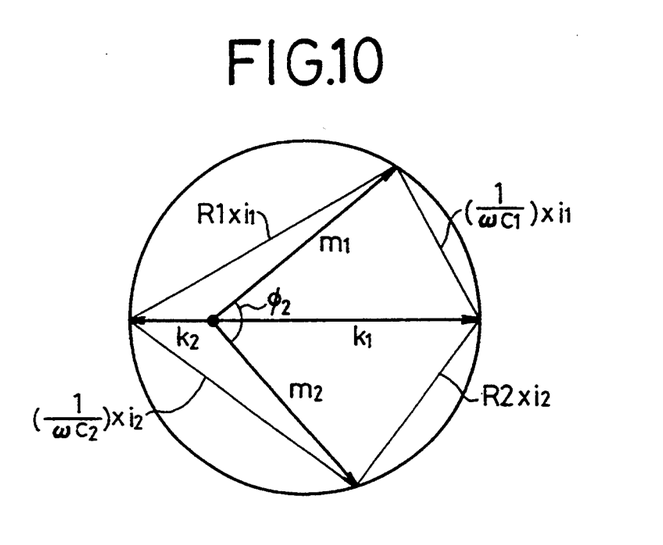
FIG. 10 is a diagram of vectors illustrative of the manner in which the second phase converter shown in FIG. 5 operates.

The positive- and negative-phase carriers $k_1$ and $k_2$ outputted from the second amplitude ratio control circuit 12 are applied through the respective buffer amplifiers 141 and 142 to the phase shifters 145 and 148. It is assumed that a current $i_1$ flows through the phase shifter 145, a current $i_2$ flows through the phase shifter 148, the capacitors 143 and 147 have respective electrostatic capacitances C1 and C2, and the resistors 144 and 146 have respective resistances R1 and R2. If the applied positive- and negative-phase carriers $k_1$ and $k_2$ have the same amplitude, then the carriers $m_1$ and $m_2$ outputted from the respective phase shifters 145 and 148 have a phase difference $\phi_1$ as shown in FIG. 9. If the amplitudes of the applied positive- and negative-phase carriers $k_1$ and $k_2$ are brought out of balance, and hence the applied positive- and negative-phase carriers $k_1$ and $k_2$ have different amplitudes (the amplitude of the carrier $k_1 >$ the amplitude of the carrier $k_1$), then the carriers $m_1$ and $m_2$ have a phase difference $\phi_2$ as shown in FIG. 10, so that the phase difference $\phi$ between the carriers $m_1$ and $m_2$ is varied based on the detected phase difference signal p. The amplitude ratio of the carriers $k_1$ and $k_2$ is thus controlled to achieve a phase difference $\phi$ ($=90°$) which eliminate the detected phase difference signal p.

The amplitudes of the carriers $m_1$ and $m_2$ outputted from the second phase converter 14 are limited respectively by the limiters 16 and 18. Carriers $n_1$ and $n_2$ whose amplitudes have been limited by the limiters 16 and 18 are supplied to the phase difference detector 20 which detects the difference between 90° and the phase difference between the carriers $n_1$ and $n_2$. The phase difference detector 20 supplies a detected output signal as the detected phase difference signal p to the second amplitude ratio control circuit 12. Therefore, the phase difference $\phi$ between the carriers $n_1$ and $n_2$ is controlled into 90°.

The carrier $n_1$ is also supplied to the multiplier 22 which multiplies the carrier $n_1$ by a sine component of the baseband signal, and the carrier $n_2$ is also supplied to the multiplier 24 which multiplies the carrier $n_2$ by a cosine component of the baseband signal. Product output signals from the multipliers 22, 24 are added by the inphase adder 26, whose sum output signal is amplified by the amplifier 28. The amplified signal is outputted as a quadrature-modulated signal.

The amplitudes of the signals inputted to and outputted from the amplifier 28 are limited by the limiters 30, 32, respectively. The phases of limited output signals from the limiters 30, 32 are compared by the phase comparator 34, which supplies a compared phase output signal to the first amplitude ratio control circuit 6. The first amplitude ratio control circuit 6 controls the amplitude ratio to correct a phase distortion caused by the amplifier 28.

The first phase controller 1 composed of the first differential converter 4, the first amplitude ratio control circuit 6, and the first phase converter 8 is inserted between the carrier oscillator 2 and the second differential converter 10. However, the first phase controller 1 may be connected between the in-phase adder 26 and the amplifier 28 to control the phase difference between the carriers supplied to the multipliers 22, 24 into 90° for outputting a quadrature-modulated signal that has been corrected out of a phase distortion caused by the amplifier 28.

Figure 11:
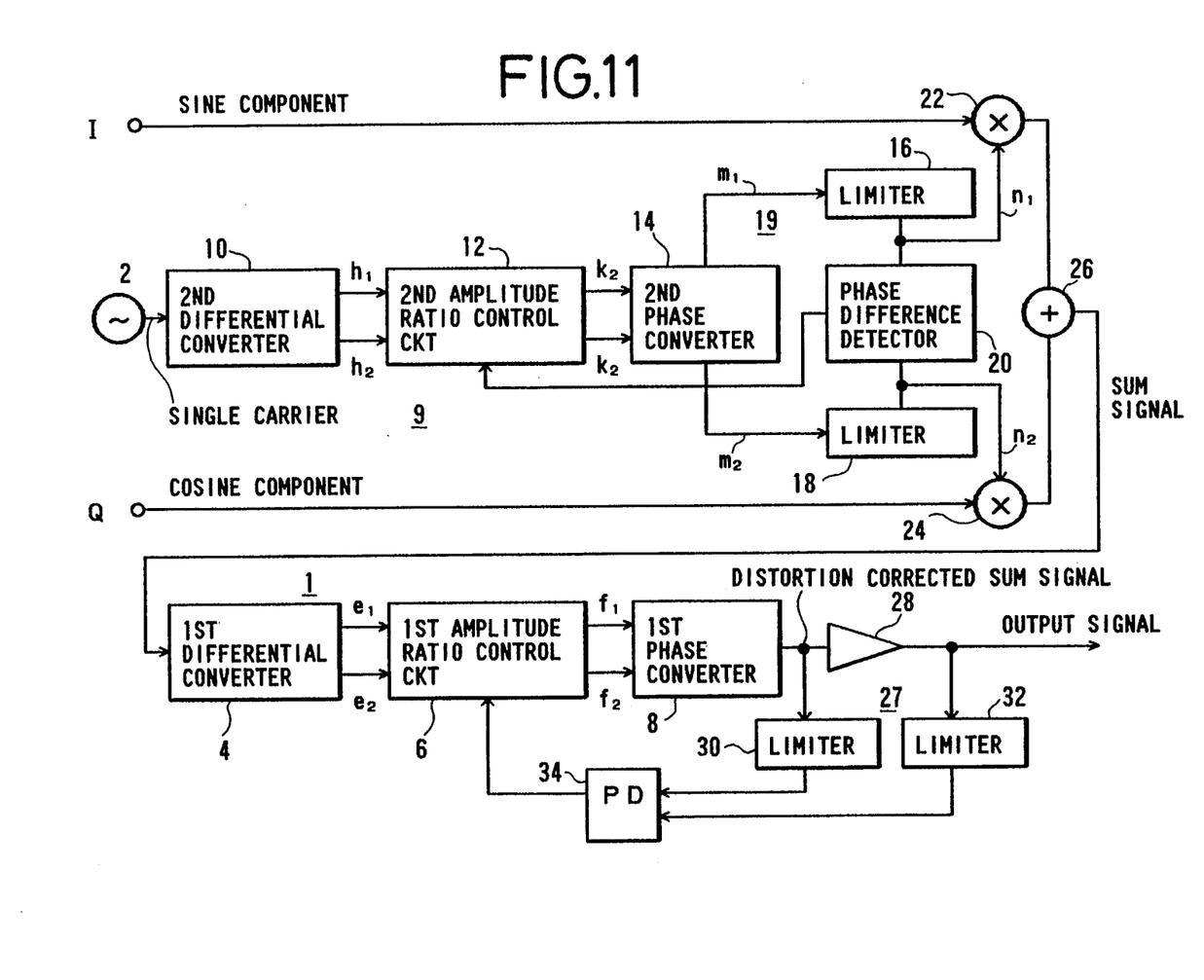
FIG. 11 is a block diagram of a quadrature modulator as a second embodiment according to the present invention.

As shown in FIG. 11, in a quadrature modulator as a second embodiment according to the present invention, the arrangement of the first phase controller 1 and the second phase controller 9 is inverted from that of the first embodiment described above. The first and second phase controllers 1 and 2 comprise respectively the same components as those in the first embodiment. Therefore, a detailed description of the second embodiment is omitted.

Although certain preferred embodiments of the present invention have been shown, it should be understood that various changes and modifications may be made therein without departing from the scope of the appended claims.

What is claimed is:

1. A quadrature modulator for producing a quadrature-modulated output signal by multiplying one of two carriers which are 90° out of phase with each other by a sine component of a baseband signal, multiplying the other of the two carriers by a cosine component of the baseband signal, and adding the products of said multiplication to each other to produce said quadrature-modulated output signal, said quadrature modulator comprising:

phase distortion detecting means for detecting a phase distortion suffered when a sum signal produced by adding the products of said multiplication to each other is amplified to produce said quadrature-modulated output signal;

phase distortion correcting means for producing a phase-corrected carrier signal by correcting the phase of a single carrier generated by a carrier oscillator, based on the phase distortion detected by said phase distortion detecting means;

phase difference detecting means for detecting the difference between 90° and the phase difference between said two carriers; and carrier generating means for generating said two carriers from said phase-corrected carrier signal, to be multiplied by the respective sine and cosine components of the baseband signal, and controlling a phase difference between said two carriers to be 90° based on the phase difference detected by said phase difference detecting means, said carrier generating means including an adder for producing said sum signal.

2. A quadrature modulator according to claim 1, wherein said phase distortion correcting means comprises:

positive- and negative-phase carrier generating means for generating positive- and negative-phase carriers from said single carrier applied thereto;

amplitude ratio controlling means for controlling the amplitude ratio of the positive- and negative-phase carriers generated by said positive- and negative-phase carrier generating means, based on the phase distortion detected by said phase distortion detecting means; and a phase converter comprising a capacitor having one terminal for being supplied with the positive-phase carrier outputted from said amplitude ratio controlling means, and a resistor having one terminal for being supplied with the negative-phase carrier outputted from said amplitude ratio controlling means, said resistor having an other terminal connected to an other terminal of said capacitor, and said phase converter having an output terminal connected to the junction between the other terminals of the capacitor and the resistor.

3. A quadrature modulator according to claim 1, wherein said carrier generating means comprises:

positive- and negative-phase carrier generating means for generating positive- and negative-phase carriers from said phase-corrected carrier signal applied thereto;

amplitude ratio controlling means for controlling the amplitude ratio of the positive- and negative-phase carriers generated by said positive- and negative-phase carrier generating means, based on the phase distortion detected by said phase distortion detecting means;

a first phase converter comprising a first capacitor having one terminal for being supplied with the positive-phase carrier outputted from said amplitude ratio controlling means, and a first resistor having one terminal for being supplied with the negative-phase carrier outputted from said amplitude ratio controlling means, said first resistor having an other terminal connected to an other terminal of said first capacitor, said first phase converter having an output terminal connected to the junction between the other terminals of the first capacitor and the first resistor; and a second phase converter comprising a second resistor having one terminal for being supplied with the positive-phase carrier outputted from said amplitude ratio controlling means, and a second capacitor having one terminal for being supplied with the negative-phase carrier outputted from said amplitude ratio controlling means, said second capacitor having an other terminal connected to an other terminal of said second resistor, said second phase converter having an output terminal connected to the junction between the other terminals of the second resistor and the second capacitor.

4. A quadrature modulator according to claim 1, wherein said phase distortion detecting means comprises a phase comparator for comparing the phase of the sum signal and the phase of the quadrature modulated output signal, and producing a compared phase output signal as a detected phase distortion signal.

* * * * *